United States Patent
Ishikawa et al.

(10) Patent No.: US 10,103,328 B2
(45) Date of Patent: Oct. 16, 2018

(54) NONVOLATILE MEMORY DEVICE

(71) Applicant: Toshiba Memory Corporation, Minato-ku (JP)

(72) Inventors: Takayuki Ishikawa, Yokkaichi (JP); Harumi Seki, Yokkaichi (JP); Shosuke Fujii, Kuwana (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 118 days.

(21) Appl. No.: 15/387,105

(22) Filed: Dec. 21, 2016

(65) Prior Publication Data

US 2017/0271585 A1  Sep. 21, 2017

(30) Foreign Application Priority Data

Mar. 18, 2016 (JP) .................. 2016-056055

(51) Int. Cl.
*H01L 27/24* (2006.01)
*H01L 45/00* (2006.01)

(52) U.S. Cl.
CPC ........ *H01L 45/1233* (2013.01); *H01L 45/145* (2013.01)

(58) Field of Classification Search
CPC ............. H01L 27/2463; H01L 27/2409; H01L 45/1233; H01L 45/08; H01L 45/145; H01L 45/146
See application file for complete search history.

(56) References Cited

U.S. PATENT DOCUMENTS

| 8,456,891 | B2 | 6/2013 | Baek et al. |
| 8,664,632 | B2 | 3/2014 | Matsushita et al. |
| 8,779,406 | B2 | 7/2014 | Ito et al. |
| 2008/0272363 | A1* | 11/2008 | Mouli ................. H01L 27/1021 257/14 |
| 2009/0014707 | A1 | 1/2009 | Lu et al. |
| 2012/0223284 | A1 | 9/2012 | Tamai |
| 2013/0240822 | A1 | 9/2013 | Wada |

(Continued)

FOREIGN PATENT DOCUMENTS

| JP | 2012-69609 A | 4/2012 |
| JP | 2012-186253 A | 9/2012 |
| JP | 2013-157511 A | 8/2013 |

(Continued)

*Primary Examiner* — Joseph Galvin, III
(74) *Attorney, Agent, or Firm* — Oblon, McClelland, Maier & Neustadt, L.L.P.

(57) ABSTRACT

According to one embodiment, a nonvolatile memory device includes a first conductive layer, a second conductive layer, and an intermediate layer. The first conductive layer includes a first element. The first element includes a at least one selected from the group consisting of Ag, Cu, Ni, Co, Ti, Al, and Au. The intermediate layer is provided between the first conductive layer and the second conductive layer. The intermediate layer includes an oxide. The oxide includes a second element and a third element. The second element includes at least one second element being selected from the group consisting of Ti, Ta, Hf, W, Mg, Al, and Zr. The third element is different from the second element and includes at least one selected from the group consisting of Si, Ge, Hf, Al, Ta, W, Zr, Ti, and Mg.

20 Claims, 5 Drawing Sheets (56) References Cited

U.S. PATENT DOCUMENTS

2014/0203864 A1\* 7/2014 Williams ........... G11C 13/0009
327/534
2014/0284540 A1 9/2014 Suguro

FOREIGN PATENT DOCUMENTS

| JP | 2013-197206 A | 9/2013 |
|----|---------------|--------|
| JP | 2014-22660 A | 2/2014 |
| JP | 2014-187168 A | 10/2014 |
| WO | WO2013/111548 A1 | 8/2013 |

\* cited by examiner

NONVOLATILE MEMORY DEVICE

CROSS-REFERENCE TO RELATED APPLICATIONS

This application is based upon and claims the benefit of priority from Japanese Patent Application No. 2016-056055, filed on Mar. 18, 2016; the entire contents of which are incorporated herein by reference.

FIELD

Embodiments described herein relate generally to a nonvolatile memory device.

BACKGROUND

Resistive random access memory (ReRAM) is a nonvolatile memory device in which the resistance can be changed electrically. It is desirable to increase the bit density of such a nonvolatile memory device.

DETAILED DESCRIPTION

According to one embodiment, a nonvolatile memory device includes a first conductive layer, a second conductive layer, and an intermediate layer. The first conductive layer includes a first element. The first element includes a first element selected from the group consisting of Ag, Cu, Ni, Co, Ti, Al, and Au. The intermediate layer is provided between the first conductive layer and the second conductive layer. The intermediate layer includes an oxide. The oxide includes a second element and a third element. The second element includes at least one selected from the group consisting of Ti, Ta, Hf, W, Mg, Al, and Zr. The third element is different from the second element and includes at least one selected from the group consisting of Si, Ge, Hf, Al, Ta, W, Zr, Ti, and Mg. The intermediate layer has a first position inside the intermediate layer, a second position inside the intermediate layer and a third position inside the intermediate layer, the second position being located between the first position and the second conductive layer, the third position being located between the second position and the second conductive layer. A concentration of oxygen at the first position is higher than a concentration of oxygen at the second position. A concentration of oxygen at the third position is higher than the concentration of oxygen at the second position. A concentration of the second element at the first position is lower than a concentration of the second element at the second position. A concentration of the second element at the third position is higher than the concentration of the second element at the second position.

According to another embodiment, a nonvolatile memory device includes a first conductive layer, a second conductive layer, and an intermediate layer. The first conductive layer includes a first element including at least one selected from the group consisting of Ag, Cu, Ni, Co, Ti, Al, and Au. The intermediate layer is provided between the first conductive layer and the second conductive layer. The intermediate layer includes an oxide. The oxide includes a second element and a third element. The second element includes at least one selected from the group consisting of Ti, Ta, Hf, W, Mg, Al, and Zr. The third element is different from the second element and includes at least one selected from the group consisting of Si, Ge, Hf, Al, Ta, W, Zr, Ti, and Mg. The intermediate layer has a first position inside the intermediate layer, a second position inside the intermediate layer, a third position inside the intermediate layer, a fourth position inside the intermediate layer, and a fifth position inside the intermediate layer. The second position is located between the first position and the second conductive layer. The third position is located between the second position and the second conductive layer. The fourth position is located between the second position and the third position. The fifth position is located between the second position and the fourth position. A concentration of oxygen at the first position is higher than a concentration of oxygen at the second position. A concentration of oxygen at the third position is higher than the concentration of oxygen at the second position. A concentration of oxygen at the fourth position is lower than the concentration of oxygen at the third position. A concentration of oxygen at the fifth position is higher than the concentration of oxygen at the second position and higher than the concentration of oxygen at the fourth position. A concentration of the second element at the first position is lower than a concentration of the second element at the second position. A concentration of the second element at the third position is lower than a concentration of the second element at the fourth position. A concentration of the second element at the fifth position is higher than the concentration of the second element at the second position and higher than the concentration of the second element at the fourth position.

According to another embodiment, a nonvolatile memory device includes a first conductive layer, a second conductive layer, and an intermediate layer. The first conductive layer includes a first element including at least one selected from the group consisting of Ag, Cu, Ni, Co, Ti, Al, and Au. The intermediate layer is provided between the first conductive layer and the second conductive layer. The intermediate layer includes an oxide. The oxide includes a second element and a third element. The second element includes at least one selected from the group consisting of Ti, Ta, Hf, W, Mg, Al, and Zr. The third element is different from the second element and includes at least one selected from the group consisting of Si, Ge, Hf, Al, Ta, W, Zr, Ti, and Mg. The intermediate layer includes a first region, a second region, and a third region. The second region is provided around the first region. The third region is provided between the first region and the second region. A concentration of oxygen in the first region is higher than a concentration of oxygen in the third region. A concentration of oxygen in the second region is higher than the concentration of oxygen in the third region. The concentration of the second element in the second region is lower than a concentration of the second element in the third region. The concentration of the second element in the first region is higher than the concentration of the second element in the third region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1A:
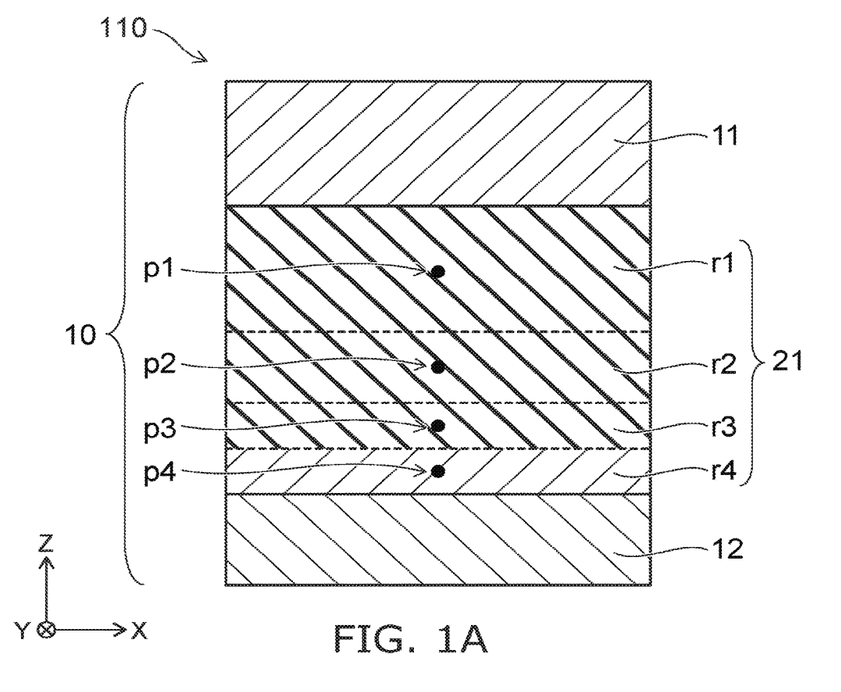
FIG. 1A to FIG. 1C are schematic views illustrating a nonvolatile memory device according to a first embodiment.
Figure 1B:
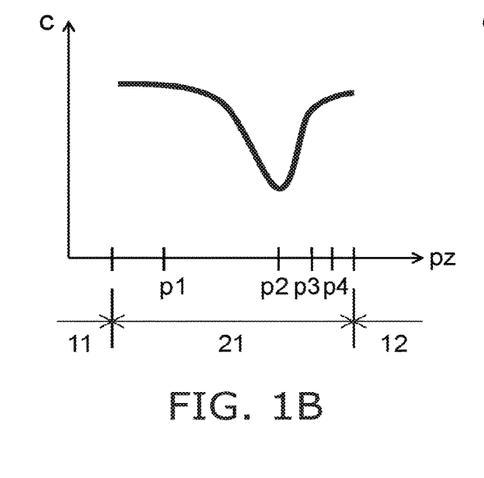
Figure 1C:
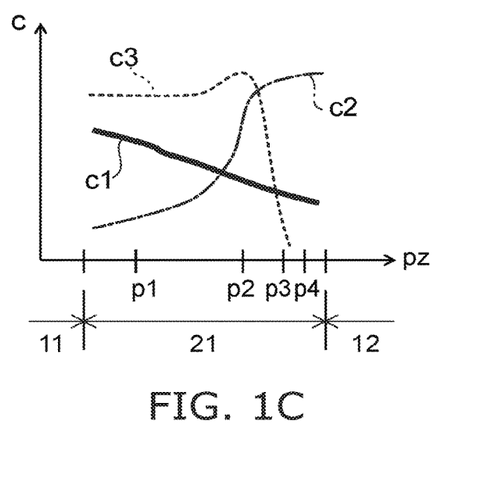

FIG. 1A to FIG. 1C are schematic views illustrating a nonvolatile memory device according to a first embodiment.

FIG. 1A is a schematic cross-sectional view. FIG. 1B is a graph illustrating the concentration distribution of oxygen. FIG. 1C is a graph illustrating concentration distributions of elements included in the nonvolatile memory device.

As shown in FIG. 1A, the nonvolatile memory device 110 according to the embodiment includes a stacked body 10. The stacked body 10 includes a first conductive layer 11, a second conductive layer 12, and an intermediate layer 21.

The second conductive layer 12 is provided to be separated from the first conductive layer 11 in a first direction. The intermediate layer 21 is provided between the first conductive layer 11 and the second conductive layer 12.

The first conductive layer 11 includes a first element. The first element includes a metal that is ionized easily. The first element is, for example, at least one selected from the group consisting of silver (Ag), copper (Cu), nickel (Ni), cobalt (Co), titanium (Ti), aluminum (Al), and gold (Au). The first element is, for example, Ag. As a voltage is applied to the nonvolatile memory device 110, the first element of the first conductive layer 11 is ionized, enters the intermediate layer 21, and precipitates inside the intermediate layer 21. The first conductive layer 11 functions as an ion source electrode.

The second conductive layer 12 includes a material that is chemically inert and ionizes less easily than the first element. The second conductive layer 12 includes, for example, at least one selected from the group consisting of tungsten (W), platinum (Pt), tantalum (Ta), molybdenum (Mo), titanium nitride (TiN), tantalum nitride (TaN), and tungsten nitride (WN). The second conductive layer 12 may include, for example, at least one of silicon (Si) or germanium (Ge). The second conductive layer 12 may include a semiconductor doped with a high concentration. For example, Si that is doped with a high concentration, Ge that is doped with a high concentration, or the like is used. The second conductive layer 12 functions as a counter electrode.

The intermediate layer 21 includes an oxide. The oxide includes a second element and a third element. The second element is, for example, at least one selected from the group consisting of Ti, Ta, hafnium (Hf), W, Mg, Al, and zirconium (Zr). The second element is, for example, Ti. The third element is different from the second element. The third element is, for example, at least one of Si or Ge. The third element may be, for example, at least one selected from the group consisting of Hf, Al, Ta, W, Zr, Ti, and Mg. The third element is, for example, Si.

The intermediate layer 21 functions as a variable resistance layer. The resistance of the intermediate layer 21 changes due to a voltage applied to the nonvolatile memory device 110. For example, the intermediate layer 21 transitions to a low resistance state according to the voltage application when programming and transitions to a high resistance state according to the voltage application when erasing. In the nonvolatile memory device 110, for example, the direction of the voltage application when programming is the reverse orientation of the direction of the voltage application when erasing. For example, the nonvolatile memory device 110 functions as a nonvolatile resistive random access memory element having a bipolar operation.

A direction (the first direction) from the second conductive layer 12 toward the first conductive layer 11 is taken as a Z-axis direction. One direction perpendicular to the Z-axis direction is taken as an X-axis direction. One direction perpendicular to the Z-axis direction and the X-axis direction is taken as a Y-axis direction.

The intermediate layer 21 has a first position p1, a second position p2, a third position p3, and a fourth position p4. The first position p1 is along the Z-axis direction. The second position p2 is positioned between the first position p1 and the second conductive layer 12. The third position p3 is positioned between the second position p2 and the second conductive layer 12. The fourth position p4 is positioned between the third position p3 and the second conductive layer 12. The four positions may be located in a portion of regions respectively in four X-Y planes. For example, the intermediate layer 21 includes a first region r1 including the first position p1, a second region r2 including the second position p2, a third region r3 including the third position p3, and a fourth region r4 including the fourth position p4.

FIG. 1B illustrates the concentration distribution of oxygen of the intermediate layer 21. In FIG. 1B, the horizontal axis shows a position pz in the Z-axis direction. The vertical axis shows a concentration c of oxygen. FIG. 1C illustrates the concentration distributions of the first to third elements of the intermediate layer 21. In FIG. 1C, the horizontal axis shows the position pz in the Z-axis direction. The vertical axis shows the concentrations c of the elements. A concentration distribution c1 shows the concentration distribution of the first element (e.g., Ag). A concentration distribution c2 shows the concentration distribution of the second element (e.g., Ti). A concentration distribution c3 shows the concentration distribution of the third element (e.g., Si).

As shown in FIG. 1B, the concentration of oxygen at the first position p1 is higher than the concentration of oxygen at the second position p2. The concentration of oxygen at the third position p3 is higher than the concentration of oxygen at the second position p2. The first region r1 includes an oxide of the third element (e.g., Si). The second region r2 includes an oxygen-poor oxide of the third element (e.g., Si). The oxide is, for example, $SiO_2$. For example, the oxygen-poor oxide is represented by $SiO_{2-x}$ (0<x<2). The oxygen-poor oxide is formed by reducing the oxygen of the oxide. The concentration of oxygen in the first region r1 is higher than the concentration of oxygen in the second region r2.

In the example of FIG. 1B, the oxygen concentration of the intermediate layer 21 has a minimum value at the second position p2.

As shown in FIG. 1C, the concentration of the second element (e.g., Ti) at the first position p1 is lower than the concentration of the second element at the second position p2. The concentration of the second element at the third position p3 is higher than the concentration of the second element at the second position p2. The concentration of the second element at the fourth position p4 is higher than the concentration of the second element at the third position p3. The third region r3 includes an oxide of the second element. The fourth region r4 includes the second element. The second element is, for example, Ti. The oxide is, for example, $TiO_2$. For example, the oxide is formed by oxidizing the second element. It is desirable for the thickness of the fourth region r4 to be, for example, 5 nanometers (nm) or less. It is desirable for the thickness of the third region r3 to be, for example, 2 nm or less.

It is desirable for the absolute value of the standard free energy of formation per oxygen atom of the oxide of the second element to be greater than the absolute value of the standard free energy of formation per oxygen atom of the oxide of the third element. The standard free energy of formation (the standard Gibbs free energy of formation) refers to the free energy per oxygen atom required to form a unit amount of the oxide under atmospheric pressure (1 atmosphere at 25° C.). The material becomes more stable chemically as the absolute value of the standard free energy of formation increases. In the example, the oxide of the second element is chemically more stable than the oxide of the third element.

In the embodiment, the oxygen inside the intermediate layer 21 is reduced by providing the intermediate layer 21 between the first conductive layer 11 and the second conductive layer 12. Thereby, for example, the stress that is applied to the conducting filament formed in the intermediate layer 21 is reduced; and the retention characteristics of the conducting filament can be improved. For example, stable operations can be performed even for a high bit density in which the size of the memory unit (the cell size) is small. According to the embodiment, the bit density can be increased.

There is a reference example in which the ion source electrode includes a AgTi alloy, the counter electrode includes $p^+$-Si, and the variable resistance layer includes $SiO_2$ in the nonvolatile memory device. The results of component analysis show that Ti precipitates and $TiO_2$ is formed at the interface between the AgTi alloy and the $SiO_2$. That is, it is considered that the AgTi alloy, Ti, $TiO_2$, and $SiO_2$ are in this order from the ion source electrode toward the variable resistance layer.

As shown in FIG. 1C, the concentration of the first element (e.g., Ag) is high at the first position p1 and decreases in the order of the second position p2, the third position p3, and the fourth position p4. The concentration of the third element (e.g., Si) is relatively high at the first position p1 and the second position p2 and is lower at the fourth position p4 than at the third position p3. In the example, the concentration of the third element at the second position p2 is higher than the concentration of the third element at the first position p1. The concentration of the third element at the second position p2 is higher than the concentration of the third element at the third position p3.

Figure 2:
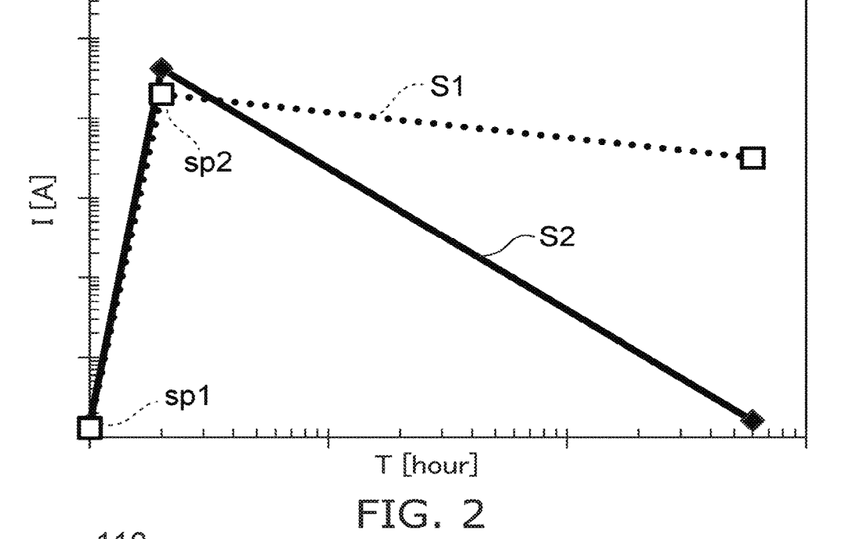
FIG. 2 is a graph illustrating characteristics of the nonvolatile memory device.

FIG. 2 is a graph illustrating characteristics of the nonvolatile memory device.

FIG. 2 illustrates the retention characteristics of the conducting filament according to reference examples. In FIG. 2, the horizontal axis shows a time T (hours). The vertical axis shows a current I (A). A retention characteristic S1 of a reference example in which the ion source electrode includes the AgTi alloy and a retention characteristic S2 of a reference example in which the ion source electrode includes Ag are shown.

FIG. 2 shows the time transient of the read current value. A point sp1 of the retention characteristic S1 is the current value in the high resistance state (the OFF state); and a point sp2 of the retention characteristic S1 is the current value in the low resistance state (the programmed state).

The retention characteristic S2 of the reference example in which the ion source electrode includes Ag also is shown in FIG. 2. In the element, $TiO_2$ is not formed at the interface between the ion source electrode and the variable resistance layer. Conversely, in the structure (the retention characteristic S1) in which the ion source electrode includes the AgTi alloy, $TiO_2$ is formed at the interface between the ion source electrode and the variable resistance layer. As shown in FIG. 2, for the element in which $TiO_2$ is formed at the interface, the read current value after leaving idle for a constant amount of time is high; and the retention characteristics of the low resistance state are improved. That is, it is considered that the interior of the variable resistance layer is in a state of sparse oxygen due to reduction due to the $TiO_2$ formed at the interface between the ion source electrode and the variable resistance layer. In other words, it is considered that the improvement of the retention characteristics of the conducting filament becomes possible by setting the oxygen inside the variable resistance layer to be sparse.

However, as in FIG. 2, compared to the case where the ion source electrode includes Ag, the operating voltage when programming undesirably increases in the case where the ion source electrode includes the AgTi alloy. That is, there is a trade-off relationship between the decrease of the operating voltage and the improvement of the retention characteristics of the conducting filament. Therefore, it is desirable to improve the retention characteristics of the conducting filament while suppressing the operating voltage when programming.

Figure 3:
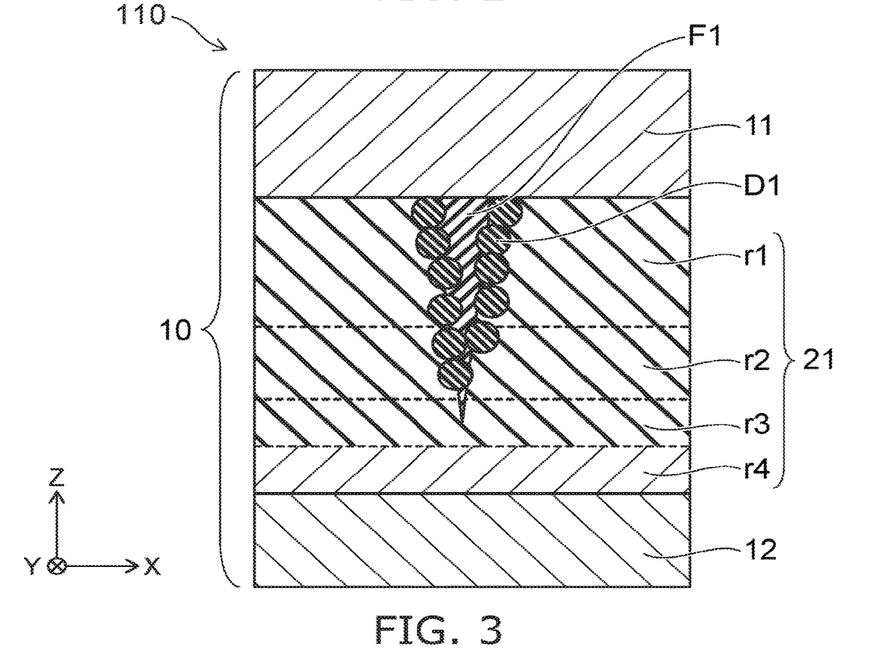
FIG. 3 is a schematic cross-sectional view illustrating a state of the nonvolatile memory device according to the first embodiment.

FIG. 3 is a schematic cross-sectional view illustrating a state of the nonvolatile memory device according to the first embodiment.

FIG. 3 illustrates the state of the conducting filament of the nonvolatile memory device.

In the nonvolatile memory device 110 according to the embodiment as shown in FIG. 3, the first conductive layer 11 includes, for example, the first element of Ag, etc. The intermediate layer 21 is provided between the first conductive layer 11 and the second conductive layer 12. The intermediate layer 21 includes the first region r1, the second region r2, the third region r3, and the fourth region r4. The first region r1 includes, for example, $SiO_2$. The second region r2 includes, for example, $SiO_{2-x}$ (0<x<2) which has a lower oxygen concentration than $SiO_2$. The third region r3 includes, for example, $TiO_2$. The fourth region r4 includes, for example, Ti. A conducting filament F1 is formed in the interior of the intermediate layer 21. The conducting filament F1 includes the first element.

The atoms of the first element of the first conductive layer 11 are ionized when programming when the voltage is applied to the nonvolatile memory device 110. The ionized atoms penetrate the intermediate layer 21. The conducting filament F1 that includes the first element is formed in the interior of the intermediate layer 21. The conducting filament F1 is strongly affected by the stress inside the intermediate layer 21. In the embodiment, the oxygen inside the first to third regions r1 to r3 decreases due to a reduction effect D1 in the fourth region r4. Therefore, the stress inside the first to third regions r1 to r3 weakens. In the conducting filament F1, the effects of the stress inside the first to third regions r1 to r3 are reduced. Thereby, the stability of the conducting filament F1 becomes high; and the retention characteristics improve.

In the embodiment, the intermediate layer 21 that includes Ti is provided between the first conductive layer 11 and the second conductive layer 12. That is, the AgTi alloy is not included in the first conductive layer 11. Therefore, the increase of the operating voltage when programming can be suppressed.

Thus, according to the embodiment, the retention characteristics of the conducting filament F1 can be improved while suppressing the increase of the operating voltage when programming. Thereby, it is possible to perform stable operations even for a high bit density. According to the embodiment, the bit density can be increased.

Operations of the nonvolatile memory device 110 according to the embodiment will now be described.

The stacked body 10 of the nonvolatile memory device 110 is utilized as one unit (e.g., the minimum unit) of the memory device. The one unit has the two memory states of the high resistance state and the low resistance state.

An example of the program operation of the nonvolatile memory device 110 will now be described with reference to FIG. 3. In the program operation, a voltage that is positive with respect to the second conductive layer 12 is applied to the first conductive layer 11. Thereby, the atoms of the first element of Ag, etc., included in the first conductive layer 11 are ionized. The ionized atoms are transported toward the intermediate layer 21 by the electric field generated inside the stacked body 10. The transported ions are reduced inside the intermediate layer 21 and form the conducting filament F1. Thereby, the electrical resistance of the stacked body 10 transitions from the high resistance state to the low resistance state.

In the erasing operation, a voltage that is positive with respect to the first conductive layer 11 is applied to the second conductive layer 12. Thereby, the first element that is included in the conducting filament F1 is transported toward the side of the first conductive layer 11; and the conducting filament F1 disappears. Thereby, the electrical resistance of the stacked body 10 transitions from the low resistance state to the high resistance state.

In the read operation, a voltage that is positive with respect to the second conductive layer 12 is applied to the first conductive layer 11 to read the memory state of the stacked body 10 to an external circuit. For example, the voltage of the read operation is different from the voltage of the program operation. A voltage of the reverse direction may be applied. For example, a voltage that is positive with respect to the first conductive layer 11 may be applied to the second conductive layer 12.

Figure 4:
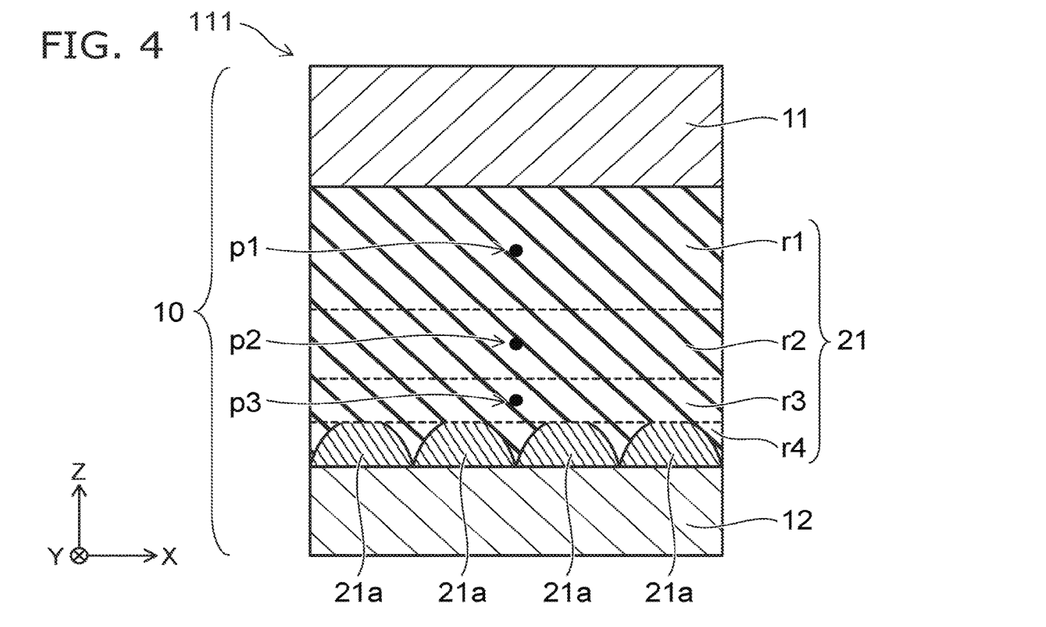
FIG. 4 is a schematic cross-sectional view illustrating another nonvolatile memory device according to the first embodiment.

FIG. 4 is a schematic cross-sectional view illustrating another nonvolatile memory device according to the first embodiment.

As shown in FIG. 4, the nonvolatile memory device 111 according to the embodiment includes the first conductive layer 11, the second conductive layer 12, and the intermediate layer 21. For example, in the intermediate layer 21, the second element may be provided in island configurations. The intermediate layer 21 has multiple protrusions 21a including the second element. The multiple protrusions 21a are provided between the third position p3 and the second conductive layer 12. The cross section of each of the multiple protrusions 21a has, for example, an arc configuration.

Second Embodiment

Figure 5:
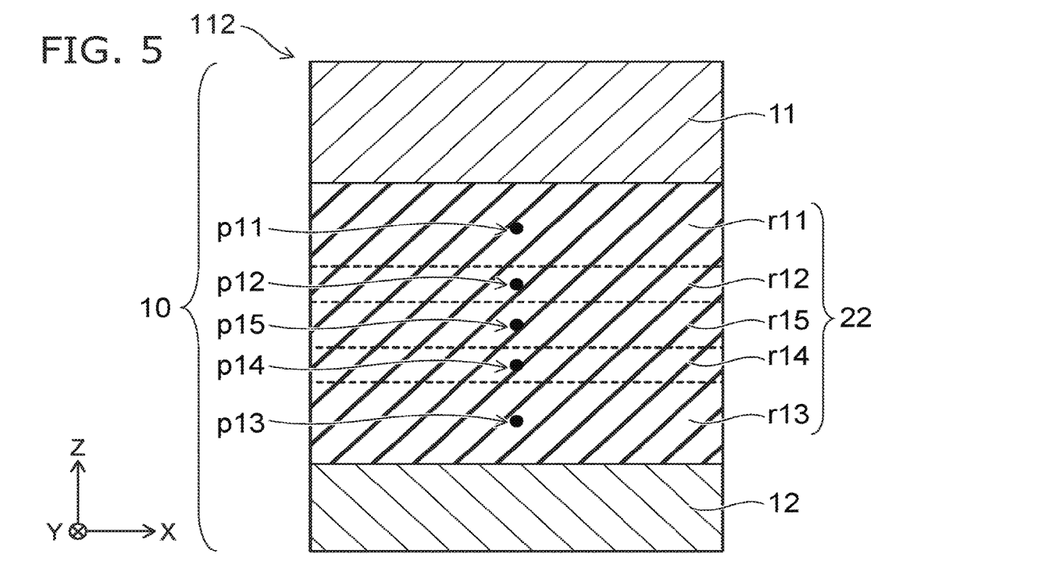
FIG. 5 is a schematic cross-sectional view illustrating a nonvolatile memory device according to a second embodiment.

FIG. 5 is a schematic cross-sectional view illustrating a nonvolatile memory device according to a second embodiment.

As shown in FIG. 5, the nonvolatile memory device 112 according to the embodiment includes the first conductive layer 11, the second conductive layer 12, and an intermediate layer 22.

The first conductive layer 11 includes the first element. The first element is, for example, at least one selected from the group consisting of Ag, Cu, Ni, Co, Ti, Al, and Au. The first element is, for example, Ag.

The second conductive layer 12 includes, for example, at least one selected from the group consisting of W, Pt, Ta, Mo, TiN, TaN, and WN. The second conductive layer 12 may include, for example, at least one of Si or Ge.

The intermediate layer 22 is provided between the first conductive layer 11 and the second conductive layer 12. The intermediate layer 22 includes an oxide. The oxide includes the second element and the third element. The third element is different from the second element. The second element is, for example, at least one selected from the group consisting of Ti, Ta, Hf, W, Mg, Al, and Zr. The third element is, for example, at least one of Si or Ge. The third element may be, for example, at least one selected from the group consisting of Hf, Al, Ta, W, Zr, Ti, and Mg. The second element is, for example, Ti. The third element is, for example, Si.

The intermediate layer 22 has a first position p11, a second position p12, a third position p13, a fourth position p14, and a fifth position p15. The second position p12 is positioned between the first position p11 and the second conductive layer 12. The third position p13 is positioned between the second position p12 and the second conductive layer 12. The fourth position p14 is positioned between the second position p12 and the third position p13. The fifth position p15 is positioned between the second position p12 and the fourth position p14.

The concentration of oxygen at the first position p11 is higher than the concentration of oxygen at the second position p12. The concentration of oxygen at the third position p13 is higher than the concentration of oxygen at the second position p12. The concentration of oxygen at the fourth position p14 is lower than the concentration of oxygen at the third position p13. The concentration of oxygen at the fifth position p15 is higher than the concentration of oxygen at the second position p12 and higher than the concentration of oxygen at the fourth position p14.

On the other hand, the concentration of the second element at the first position p11 is lower than the concentration of the second element at the second position p12. The concentration of the second element at the third position p13 is lower than the concentration of the second element at the fourth position p14. The concentration of the second element at the fifth position p15 is higher than the concentration of the second element at the second position p12 and higher than the concentration of the second element at the fourth position p14.

The intermediate layer 22 includes a first region r11 including the first position p11, a second region r12 including the second position p12, a third region r13 including the third position p13, a fourth region r14 including the fourth position p14, and a fifth region r15 including the fifth position p15. Each of the first region r11 and the third region r13 include, for example, $SiO_2$. Each of the second region r12 and the fourth region r14 include, for example, $SiO_{2-x}$ ($0<x<2$). The fifth region r15 includes, for example, $TiO_2$.

In the embodiment, a titanium oxide layer is provided between two silicon oxide layers. In other words, the oxygen inside the first to fourth regions r11 to r14 is reduced by providing the fifth region r15 between the second region r12 and the fourth region r14. Thereby, the stress that is applied to the conducting filament formed in the intermediate layer 22 is reduced; and the retention characteristics of the conducting filament can be improved. Thereby, for example, stable operations can be performed even for a high bit density in which the size of the memory unit (the cell size) is small. According to the embodiment, the bit density can be increased.

Third Embodiment

Figure 6:
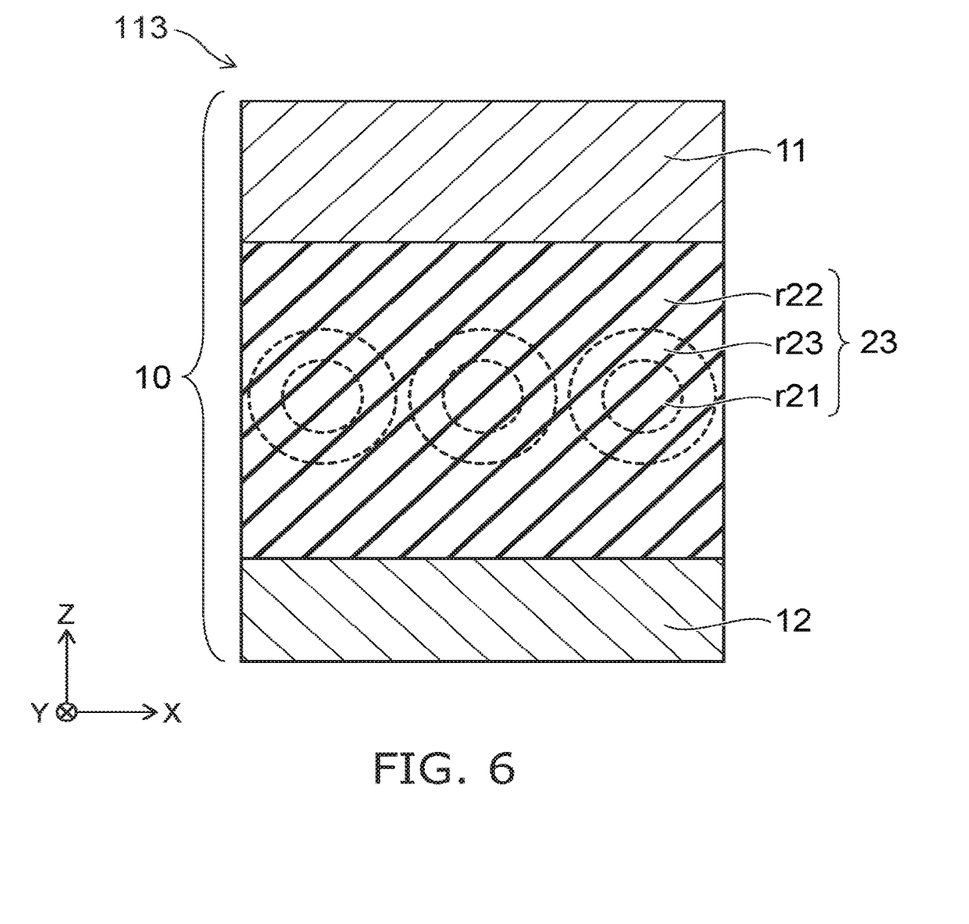
FIG. 6 is a schematic cross-sectional view illustrating a nonvolatile memory device according to a third embodiment.

FIG. 6 is a schematic cross-sectional view illustrating a nonvolatile memory device according to a third embodiment.

As shown in FIG. 6, the nonvolatile memory device 113 according to the embodiment includes the first conductive layer 11, the second conductive layer 12, and an intermediate layer 23.

The first conductive layer 11 includes the first element. The first element is, for example, at least one selected from the group consisting of Ag, Cu, Ni, Co, Ti, Al, and Au. The first element is, for example, Ag.

The second conductive layer 12 includes, for example, at least one selected from the group consisting of W, Pt, Ta, Mo, TiN, TaN, and WN. The second conductive layer 12 may include, for example, at least one of Si or Ge.

The intermediate layer 23 is provided between the first conductive layer 11 and the second conductive layer 12. The intermediate layer 23 includes an oxide. The oxide includes the second element and the third element. The third element is different from the second element. The second element is, for example, at least one selected from the group consisting of Ti, Ta, Hf, W, Mg, Al, and Zr. The third element is, for example, at least one of Si or Ge. The third element may be, for example, at least one selected from the group consisting of Hf, Al, Ta, W, Zr, Ti, and Mg. The second element is, for example, Ti. The third element is, for example, Si.

The intermediate layer 23 includes a first region r21, a second region r22, and a third region r23. The second region r22 is provided around the first region r21. The third region r23 is provided between the first region r21 and the second region r22. That is, the first region r21 does not have a layer configuration and is buried inside the intermediate layer 23 in multiple particle configurations.

The concentration of oxygen in the first region r21 is higher than the concentration of oxygen in the third region r23. The concentration of oxygen in the second region r22 is higher than the concentration of oxygen in the third region r23. The concentration of the second element in the second region r22 is lower than the concentration of the second element in the third region r23. The concentration of the second element in the first region r21 is higher than the concentration of the second element in the third region r23. The second region r22 includes, for example, $SiO_2$. The third region r23 includes, for example, $SiO_{2-x}$ ($0<x<2$). The first region r21 includes, for example, $TiO_2$.

In the embodiment, titanium oxide is buried in a particle configuration inside the silicon oxide layer. In other words, the oxygen that is inside the second and third regions r22 and r23 is reduced by providing the second and third regions r22 and r23 around the first region r21. Thereby, the stress that is applied to the conducting filament formed in the intermediate layer 23 is reduced; and the retention characteristics of the conducting filament can be improved. Thereby, for example, stable operations can be performed even for a high bit density in which the size of the memory unit (the cell size) is small. According to the embodiment, the bit density can be increased.

Fourth Embodiment

A nonvolatile memory device according to the embodiment is a cross-point memory. The stacked body 10 and modifications of the stacked body 10 described in reference to the first to third embodiments are used in the nonvolatile memory device according to the embodiment.

FIG. 7A to FIG. 7D are schematic perspective views illustrating nonvolatile memory devices according to the fourth embodiment.

Figure 7A:
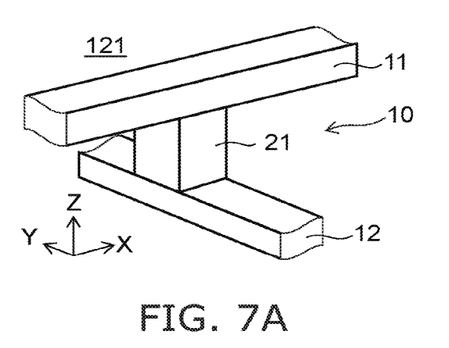
FIG. 7A to FIG. 7D are schematic perspective views illustrating nonvolatile memory devices according to the fourth embodiment.

In a nonvolatile memory device 121 according to the embodiment as shown in FIG. 7A, the first conductive layer 11 extends in the second direction. The second direction is the X-axis direction. For example, the X-axis direction is orthogonal to the Z-axis direction (the stacking direction). The second conductive layer 12 extends in the third direction. The third direction is the Y-axis direction. For example, the Y-axis direction is orthogonal to the X-axis direction and the Z-axis direction.

The intermediate layer 21 overlaps a portion of the first conductive layer 11 when projected onto a plane (the X-Y plane) perpendicular to the Z-axis direction. The intermediate layer 21 overlaps a portion of the second conductive layer 12 when projected onto the X-Y plane. The intermediate layer 21 overlaps a region where the first conductive layer 11 and the second conductive layer 12 overlap when projected onto the X-Y plane.

In the example, the first conductive layer 11 is one interconnect; and the second conductive layer 12 is one other interconnect. The intermediate layer 21 is provided at the positions where these interconnects cross.

Figure 7B:
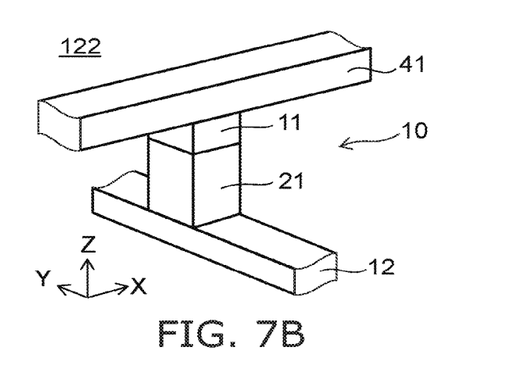

As shown in FIG. 7B, a first interconnect 41 is provided in a nonvolatile memory device 122. The first interconnect 41 extends in the X-axis direction. The second conductive layer 12 extends in the Y-axis direction. The intermediate layer 21 overlaps a portion of the second conductive layer 12 when projected onto the X-Y plane. The intermediate layer 21 and the first conductive layer 11 are provided between the first interconnect 41 and the second conductive layer 12. The stacked body 10 overlaps a portion of the first interconnect 41 when projected onto the X-Y plane.

Figure 7C:
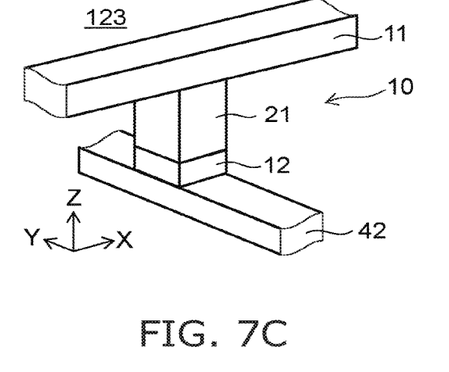

As shown in FIG. 7C, a second interconnect 42 is provided in a nonvolatile memory device 123. The second interconnect 42 extends in the Y-axis direction. The first conductive layer 11 extends in the X-axis direction. The intermediate layer 21 overlaps a portion of the first conductive layer 11 when projected onto the X-Y plane. The intermediate layer 21 and the second conductive layer 12 are provided between the second interconnect 42 and the first conductive layer 11. The stacked body 10 overlaps a portion of the second interconnect 42 when projected onto the X-Y plane.

Figure 7D:
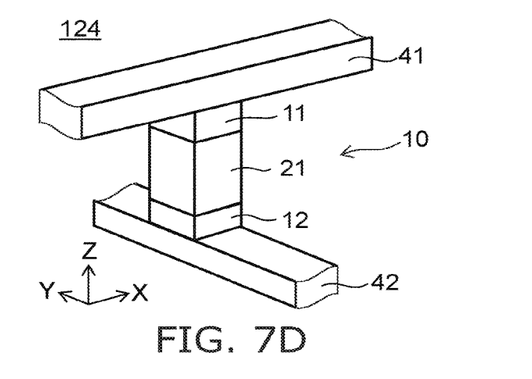

As shown in FIG. 7D, the first interconnect 41 and the second interconnect 42 are provided in a nonvolatile memory device 124. The first interconnect 41 extends in the X-axis direction. The second interconnect 42 extends in the Y-axis direction. The stacked body 10 is disposed between the first interconnect 41 and the second interconnect 42. In other words, the first conductive layer 11, the intermediate layer 21, and the second conductive layer 12 are disposed between the first interconnect 41 and the second interconnect 42.

In the embodiment, at least one of the first conductive layer 11 or the second conductive layer 12 may be used as an interconnect. An interconnect (at least one of the first interconnect 41 or the second interconnect 42) may be provided separately from the first conductive layer 11 and the second conductive layer 12.

The stacked film that includes the intermediate layer 21 may have a prism configuration or a circular columnar configuration (including a flattened circular configuration).

Figure 8:
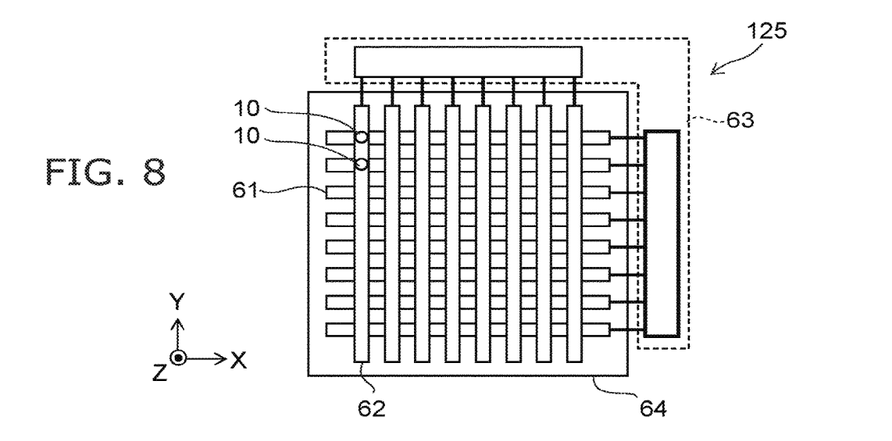
FIG. 8 is a schematic plan view illustrating the nonvolatile memory device according to the fourth embodiment.

FIG. 8 is a schematic plan view illustrating the nonvolatile memory device according to the fourth embodiment.

As shown in FIG. 8, multiple interconnects 61 and multiple interconnects 62 are provided in the nonvolatile memory device 125. The multiple interconnects 61 are parallel to each other. The multiple interconnects 62 are parallel to each other. The direction in which the interconnects 61 extend crosses the direction in which the interconnects 62 extend. The interconnects 61 include, for example, the first conductive layer 11 or the first interconnect 41. The interconnects 62 include, for example, the second conductive layer 12 or the second interconnect 42. For example, the interconnects 61 are used as word lines. For example, the interconnects 62 are used as bit lines.

The multiple stacked bodies 10 (at least the intermediate layers 21) are provided respectively at the crossing portions between the multiple interconnects 61 and the multiple interconnects 62. The interconnects 61 and the interconnects 62 are connected to a controller 63. One of the multiple stacked bodies 10 is set to a selected state by the interconnects and the interconnects 62; and a desired operation is performed. The nonvolatile memory device 125 is a cross-point resistive random access memory.

A substrate 64 is provided in the nonvolatile memory device 125. The interconnects 61 and the interconnects 62 are provided on the substrate 64. The stacking order in the stacked body 10 is arbitrary. For example, the second conductive layer 12 may be disposed between the substrate 64 and the first conductive layer 11. On the other hand, the first conductive layer 11 may be disposed between the substrate 64 and the second conductive layer 12. The Z-axis direction of the stacked body 10 may cross the major surface of the substrate 64.

The multiple stacked bodies 10 may be stacked. In other words, the embodiment is applicable to a cross-point memory having a three-dimensionally stacked structure.

According to the embodiments, a nonvolatile memory device can be provided in which the bit density can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nonvolatile memory devices such as first conductive layers, second conductive layers, intermediate layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices practicable by an appropriate design modification by one skilled in the art based on the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a first conductive layer including a first element including at least one selected from the group consisting of Ag, Cu, Ni, Co, Ti, Al, and Au;
a second conductive layer; and
an intermediate layer provided between the first conductive layer and the second conductive layer, the intermediate layer including an oxide, the oxide including a second element and a third element, the second element including at least one selected from the group consisting of Ti, Ta, Hf, W, Mg, Al, and Zr, the third element being different from the second element and including at least one selected from the group consisting of Si, Ge, Hf, Al, Ta, W, Zr, Ti, and Mg,
the intermediate layer having a first position inside the intermediate layer, a second position inside the intermediate layer and a third position inside the intermediate layer, the second position being located between the first position and the second conductive layer, the third position being located between the second position and the second conductive layer,
a concentration of oxygen at the first position being higher than a concentration of oxygen at the second position,
a concentration of oxygen at the third position being higher than the concentration of oxygen at the second position,
a concentration of the second element at the first position being lower than a concentration of the second element at the second position,
a concentration of the second element at the third position being higher than the concentration of the second element at the second position.

2. The device according to claim 1, wherein
the first element includes Ag,
the second element includes Ti, and
the third element includes Si.

3. The device according to claim 1, wherein the second conductive layer includes at least one selected from the group consisting of Si, Ge, W, Pt, Ta, Mo, TiN, TaN, and WN.

4. The device according to claim 1, wherein an absolute value of a standard free energy of formation per oxygen atom of an oxide of the second element is greater than an absolute value of a standard free energy of formation per oxygen atom of an oxide of the third element.

5. The device according to claim 1, wherein the first conductive layer extends in a second direction crossing a first direction, the first direction being from the second conductive layer toward the first conductive layer.

6. The device according to claim 1, wherein the second conductive layer extends in a direction crossing a first direction, the first direction being from the second conductive layer toward the first conductive layer.

7. The device according to claim 1, wherein
the first conductive layer extends in a second direction crossing a first direction, the first direction being from the second conductive layer toward the first conductive layer, and
the second conductive layer extends in a third direction crossing the first direction and the second direction.

8. The device according to claim 1, further comprising:
a first interconnect extending in a second direction crossing a first direction, the first direction being from the second conductive layer toward the first conductive layer; and
a second interconnect extending in a third direction crossing the first direction and the second direction,
the first conductive layer and the second conductive layer being disposed between the first interconnect and the second interconnect.

9. A nonvolatile memory device, comprising:
a first conductive layer including a first element including at least one selected from the group consisting of Ag, Cu, Ni, Co, Ti, Al, and Au;
a second conductive layer; and
an intermediate layer provided between the first conductive layer and the second conductive layer, the intermediate layer including an oxide, the oxide including a second element and a third element, the second element including at least one selected from the group consisting of Ti, Ta, Hf, W, Mg, Al, and Zr, the third element being different from the second element and including at least one selected from the group consisting of Si, Ge, Hf, Al, Ta, W, Zr, Ti, and Mg,
the intermediate layer having a first position inside the intermediate layer, a second position inside the intermediate layer, a third position inside the intermediate layer, a fourth position inside the intermediate layer, and a fifth position inside the intermediate layer,
the second position being located between the first position and the second conductive layer, the third position being located between the second position and the second conductive layer, the fourth position being located between the second position and the third position, the fifth position being located between the second position and the fourth position,
a concentration of oxygen at the first position being higher than a concentration of oxygen at the second position,
a concentration of oxygen at the third position being higher than the concentration of oxygen at the second position,
a concentration of oxygen at the fourth position being lower than the concentration of oxygen at the third position,
a concentration of oxygen at the fifth position being higher than the concentration of oxygen at the second position and higher than the concentration of oxygen at the fourth position,
a concentration of the second element at the first position being lower than a concentration of the second element at the second position,
a concentration of the second element at the third position being lower than a concentration of the second element at the fourth position,
a concentration of the second element at the fifth position being higher than the concentration of the second element at the second position and higher than the concentration of the second element at the fourth position.

10. The device according to claim 9, wherein
the first element includes Ag,
the second element includes Ti, and
the third element includes Si.

11. The device according to claim 9, wherein the second conductive layer includes at least one selected from the group consisting of Si, Ge, W, Pt, Ta, Mo, TiN, TaN, and WN.

12. The device according to claim 9, wherein an absolute value of a standard free energy of formation per oxygen atom of an oxide of the second element is greater than an absolute value of a standard free energy of formation per oxygen atom of an oxide of the third element.

13. The device according to claim 9, wherein the first conductive layer extends in a second direction crossing a first direction, the first direction being from the second conductive layer toward the first conductive layer.

14. The device according to claim 9, wherein the second conductive layer extends in a direction crossing a first direction, the first direction being from the second conductive layer toward the first conductive layer.

15. A nonvolatile memory device, comprising:
a first conductive layer including a first element including at least one selected from the group consisting of Ag, Cu, Ni, Co, Ti, Al, and Au;
a second conductive layer; and
an intermediate layer provided between the first conductive layer and the second conductive layer, the intermediate layer including an oxide, the oxide including a second element and a third element, the second element including at least one selected from the group consisting of Ti, Ta, Hf, W, Mg, Al, and Zr, the third element being different from the second element and including at least one selected from the group consisting of Si, Ge, Hf, Al, Ta, W, Zr, Ti, and Mg,
the intermediate layer including a first region, a second region, and a third region, the second region being provided around the first region, the third region being provided between the first region and the second region,
a concentration of oxygen in the first region being higher than a concentration of oxygen in the third region,
a concentration of oxygen in the second region being higher than the concentration of oxygen in the third region,
a concentration of the second element in the second region being lower than a concentration of the second element in the third region,
a concentration of the second element in the first region being higher than the concentration of the second element in the third region.

16. The device according to claim 15, wherein
the first element includes Ag,
the second element includes Ti, and
the third element includes Si.

17. The device according to claim 15, wherein the second conductive layer includes at least one selected from the group consisting of Si, Ge, W, Pt, Ta, Mo, TiN, TaN, and WN.

18. The device according to claim 15, wherein an absolute value of a standard free energy of formation per oxygen atom of an oxide of the second element is greater than an absolute value of a standard free energy of formation per oxygen atom of an oxide of the third element.

19. The device according to claim 15, wherein the first conductive layer extends in a second direction crossing a first direction, the first direction being from the second conductive layer toward the first conductive layer.

20. The device according to claim 15, wherein the second conductive layer extends in a direction crossing a first direction, the first direction being from the second conductive layer toward the first conductive layer.

* * * * *